United States Patent [19]

Kato

[11] Patent Number: 5,405,035
[45] Date of Patent: Apr. 11, 1995

[54] JUNCTION BOX CASE LOCKING STRUCTURE

[75] Inventor: Shinsyu Kato, Yokkaichi, Japan

[73] Assignee: Sumitomo Wiring Systems, Ltd., Yokkaichi, Japan

[21] Appl. No.: 187,528

[22] Filed: Jan. 28, 1994

[30] Foreign Application Priority Data

Mar. 9, 1993 [JP] Japan .............. 5-009889 U

[51] Int. Cl.6 ............................................. B65D 41/18
[52] U.S. Cl. ................................... 220/3.8; 220/4.24; 220/326
[58] Field of Search ............. 220/3.8, 4.21, 4.24, 220/354, 355, 324, 326, 241, 242, 307; 215/216, 225

[56] References Cited

U.S. PATENT DOCUMENTS

| | | | |
|---|---|---|---|
| 3,117,691 | 1/1964 | Williams | 220/354 |
| 4,371,743 | 2/1983 | Decker . | |
| 4,482,176 | 11/1984 | Rider, Jr. et al. . | |
| 4,512,494 | 4/1985 | Von Holdt | 220/354 |
| 4,719,542 | 1/1988 | Lemmer . | |
| 4,840,286 | 6/1989 | Heberling et al. | 220/307 |
| 4,896,784 | 1/1990 | Heath | 220/3.8 |
| 5,097,977 | 3/1992 | Straub | 220/354 |
| 5,152,416 | 10/1992 | Cassel | 220/355 |
| 5,295,858 | 3/1994 | Kasai et al. . | |

Primary Examiner—Stephen J. Castellano
Attorney, Agent, or Firm—Sandler, Greenblum & Bernstein

[57] ABSTRACT

Three of the side walls of the upper and lower cases are locked together by use of corresponding locking holes and claws. The cases are locked together at the remaining one side at which a mounting stay is provided by a vertically extending locking channel and locking flange, which are provided separately on the upper and lower cases. Any external force working from the stay to open the side wall of the case to the outside is thus restricted by engagement of the locking flange and channel.

4 Claims, 4 Drawing Sheets

JUNCTION BOX CASE LOCKING STRUCTURE

BACKGROUND OF THE INVENTION

1. Field of the Invention

The present invention relates to a case locking structure for junction boxes used in automotive wire harness systems.

2. Description of the Prior Art

Junction boxes used to connect a single automotive wire harness to plural electrical systems components concentrate all connections in a single box to achieve greater economy and productivity in wiring operations. Various types of junction boxes have been developed as wire harnesses have become smaller and terminal connector density has increased inside the junction box.

The typical junction box is a square plastic box comprising an upper case 1 and a lower case 2. The lower case 2 is fit inside the upper case 1 with a locking claw 2b provided on the side wall 2a of the lower case 2 engaging, from the inside of the upper case 1, a locking hole or recess 1b provided in the side wall 1a of the upper case 1.

The locking hole 1b and locking claw 2b are provided at specific points in the side walls of the upper case 1 and lower case 2, respectively, and the upper and lower cases are locked together by locking the locking claws 2b in the locking holes 1b.

The problem with this typical construction is that the locking claw 2b engages the locking hole 1b by means of the locking claw 2b projecting horizontally from the side wall 2a of the lower case 2. The locking claw 2b therefore works effectively against vertical forces (indicated by arrow a in FIG. 8), but is easily disengaged by forces applied horizontally to the case (arrow b).

As a result, when a mounting stay 3 used to mount the junction box to the body is provided on one side wall 1a of the upper case 1, a force F created by vibrations from tightening the mounting stay 3 bolt and by loads after installation acts to open the side wall 1a to the outside in the horizontal direction. This force deforms the side wall 1a of the upper case 1, causing the locking holes 1b to separate from the locking claws 2b of the lower case 2, and thus unlocking the upper case 1 from the lower case 2.

SUMMARY OF THE INVENTION

Therefore, an object of the present invention is to provide a locking mechanism for locking the upper case and lower case together with strong resistance to both horizontal and vertical forces.

To achieve this object, a junction box case locking structure according to the present invention locks the upper and lower cases together in the vertical direction by engaging a locking claw projecting horizontally from the side wall of either the upper or lower case with a locking hole provided in the side wall of the opposing case, and is characterized by providing at part of the side walls of the engaged upper and lower cases a vertically extending locking channel and locking flange for restricting horizontal movement of the cases.

This locking channel and locking flange are formed in the side walls of the engaging upper and lower cases at the part where the mounting stay projecting horizontally from the side wall of either the upper or lower case is provided.

Specifically, the lower case is fit into the inside of the box-shaped upper case, the locking claw provided in the side wall of the lower case is engaged from the inside with the locking hole provided in the side wall of the upper case at three sides of these upper and lower cases, and the locking flange and locking channel are formed in the opposing side walls of the upper and lower cases on the side at which the mounting stay is provided projecting from the side wall of the upper case.

By means of this configuration, the upper and lower cases can be locked strongly against vertical forces by engagement of the locking claw and locking hole, and simultaneously locked strongly against horizontal forces by engagement of the locking channel and locking flange. As a result, the upper and lower cases can be positively locked against forces applied in both horizontal and vertical directions.

Because the locking channel and locking flange are provided in the side walls of the upper and lower cases at the point most susceptible to external horizontal forces, specifically at the part where the mounting stay projects horizontally from the side wall, engagement of the locking channel and locking flange restricts movement to the outside of the side wall, thus preventing deformation of the side wall and disengagement of the lock even when a force acting to open the side wall horizontally to the outside is applied during installation to the vehicle.

BRIEF DESCRIPTION OF THE DRAWINGS

The present invention will become more fully understood from the detailed description given below and the accompanying diagrams wherein.

DESCRIPTION OF PREFERRED EMBODIMENTS

Figure 1:
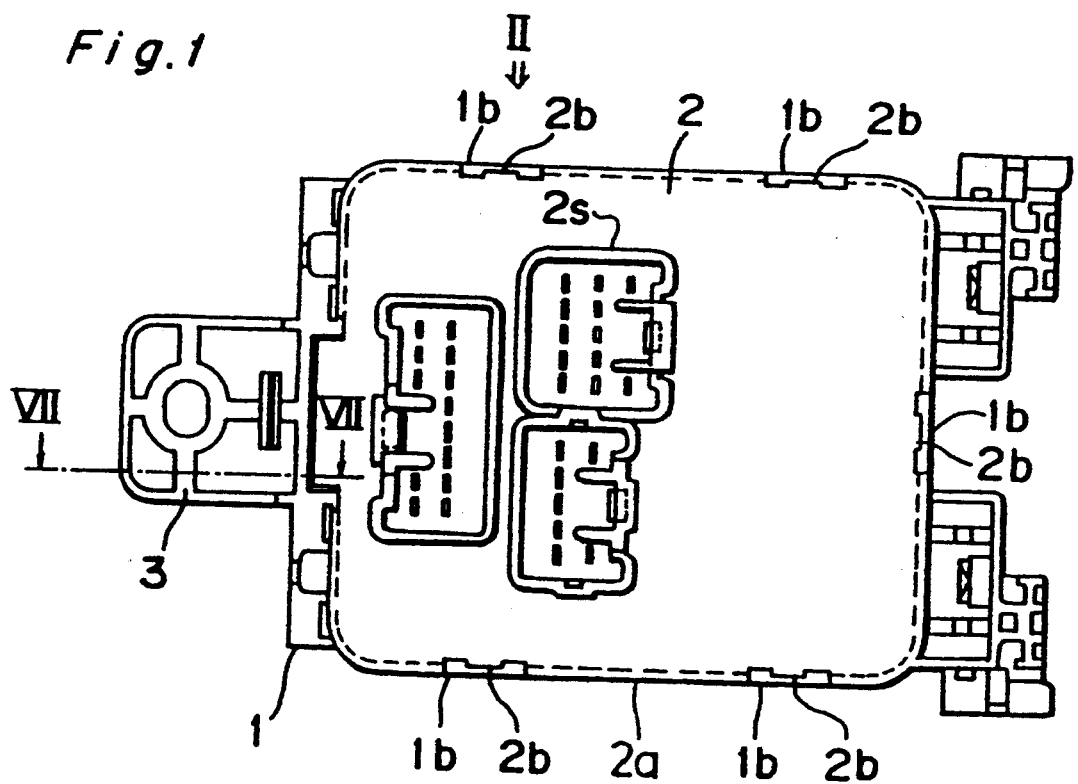
FIG. 1 is a bottom view of a junction box according to the present invention, and the view taken from direction I shown in FIG. 2.
Figure 2:
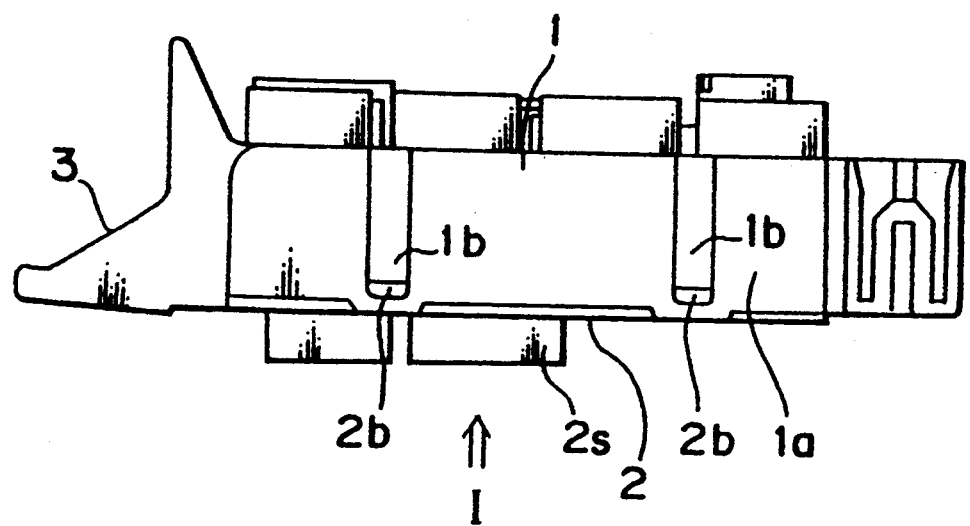
FIG. 2 is a side view taken from direction II shown in FIG. 1.

In FIG. 1, a bottom plan view of the junction box according to the present invention is shown, and is viewed from direction I shown in FIG. 2. In FIG. 2, a side view taken from direction II shown in FIG. 1 is shown. The junction box shown in FIGS. 1 and 2 is in the closed condition and comprises an upper case 1 and a lower case 2, each being a square plastic box-shaped case. The lower case 2 has projection skirt walls 2s at the bottom surface thereof for protecting electrical connection effected thereat.

A mounting stay 3 for installing the junction box to the vehicle body is provided integrally to and projecting horizontally from one of the four side walls 1a (shown as the left side wall 1a in FIG. 1) of the upper case 1. Five locking holes 1b are provided in the remaining three side walls 1a, specifically one in the right side wall 1a opposite the mounting stay 3 and two each in the other side walls.

Locking claws 2b corresponding to the locking holes 1b in the upper case 1 are provided in the corresponding three side walls 2a of the lower case 2; no locking claw 2b is provided in the remaining side wall 2a where the mounting stay 3 is located (the left wall in FIG. 1).

When the lower case 2 is fit from below into the upper case 1, the locking claws 2b of the lower case 2 engage the locking holes 1b of the upper case 1 from inside the case, thus locking the upper and lower cases 1, 2 together.

Figure 3:
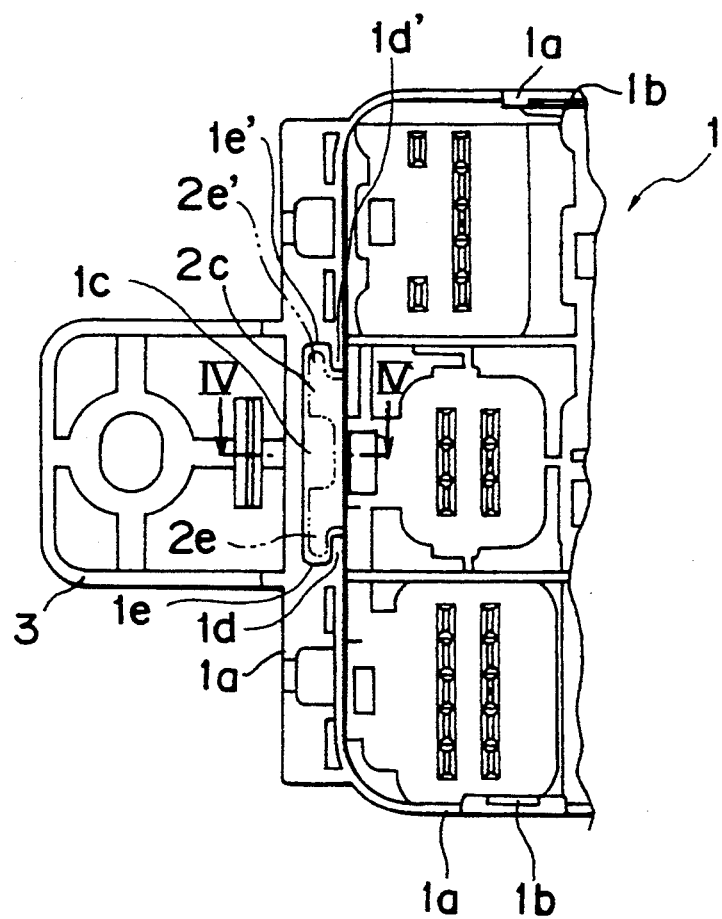
FIG. 3 is a bottom view of the major components of the upper case.
Figure 4:
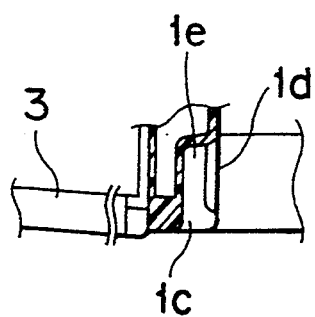
FIG. 4 is a cross sectional view taken along line IV—IV shown in FIG. 3.

In FIG. 3, the upper case 1 (lower case 2 removed) viewed from the bottom is shown. In FIG. 4, a cross-sectional view taken along line IV—IV shown in FIG. 3 is shown.

As shown in detail in FIGS. 3 and 4, the upper case 1 is formed, particularly on the inside of the side wall 1a at which the mounting stay 3 is provided, with a locking channel 1c that is wide and extending in the vertical direction and is open to the bottom, but is closed at a mid-height between the bottom and the top of the side wall 1a. The locking channel 1c is partly closed by a pair of closing walls 1d and 1d' projecting towards each other from opposite sides of the channel 1c. Grooves 1e and 1e' are formed behind the closing walls 1d and 1d', respectively. As shown by an imaginary line in FIG. 3, the locking channel 1c receives a locking flange 2c as will be described below.

Figure 5:
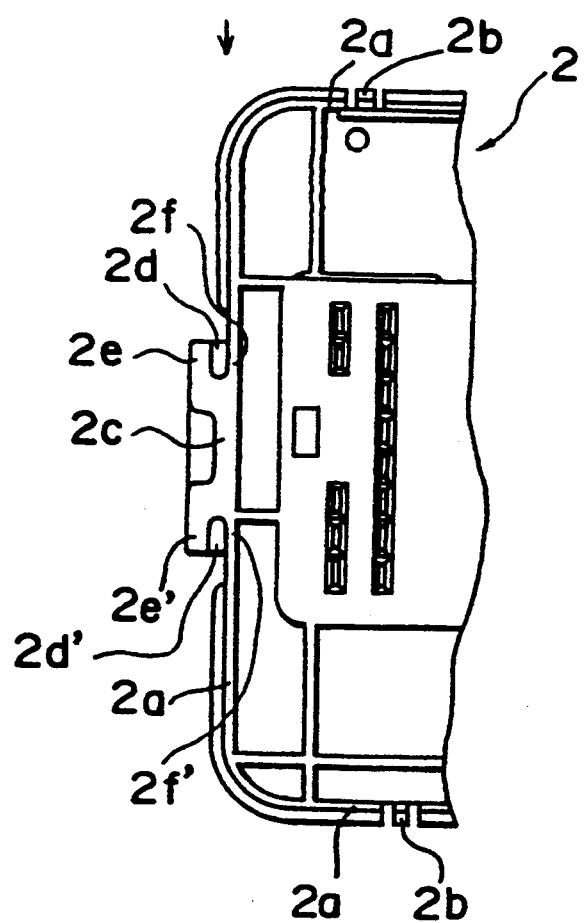
FIG. 5 is a plan view of the lower case.
Figure 6:
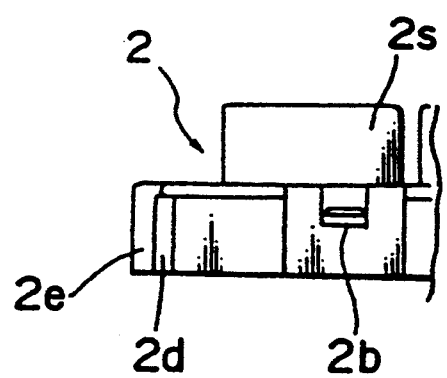
FIG. 6 is a side view of FIG. 5 taken from direction VI shown in FIG. 5.

In FIG. 5, the lower case 2 (upper case 1 removed) viewed from the top is shown. In FIG. 6, the lower case 2 viewed from direction VI shown in FIG. 5 is shown.

As shown in detail in FIGS. 5 and 6, a locking flange 2c that is similarly wide and extending in the vertical direction is provided on the outside of the side wall 2a of the lower case 2 at a place corresponding to the wall of the upper case 1 providing the locking channel 1c. The locking flange 2c has a pair of wings 2e and 2e' extending outwards. A pair of grooves 2d and 2d' are formed, respectively, under the wings 2e and 2e' in association with wall portions 2f and 2f' of the side wall.

As a result, when the lower case 2 is fit from below into the upper case 1, the locking flange 2c of the lower case 2 fits from below into the locking channel 1c of the upper case 1. More specifically, the wings 2e and 2e' engage in the grooves 1e and 1e', respectively, and the closing walls 1d and 1d' engage in the grooves 2d and 2d', respectively.

As a result of this configuration, the two cases 1 and 2 are locked together by the locking holes 1b and locking claws 2b provided on three of the side walls 1a and 2a of the upper case 1 and lower case 2, respectively. The two cases 1 and 2 are also locked together by the vertically engaged locking channel 1c and locking flange 2c provided at the remaining side walls 1a and 2a of the upper case 1 and lower case 2 at which the mounting stay 3 is provided.

Figure 7:
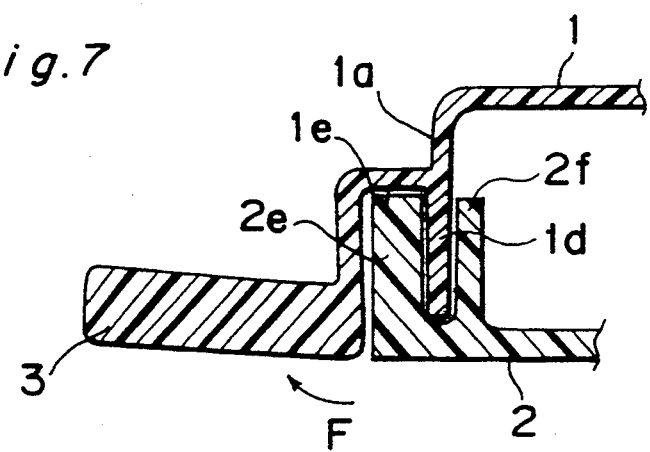
FIG. 7 is a cross sectional view take along line VII—VII shown in FIG. 1.
Figure 8:
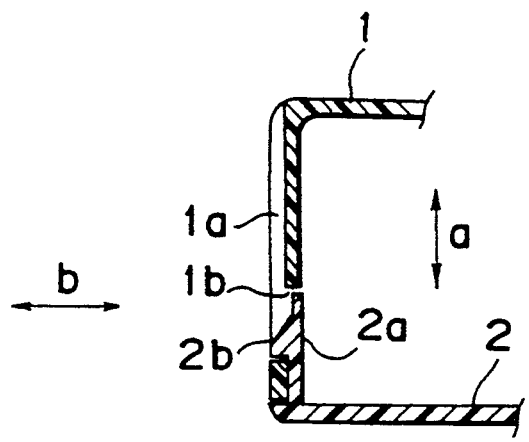
FIG. 8 is a cross sectional view of the locking member of the conventional junction box.
Figure 9:
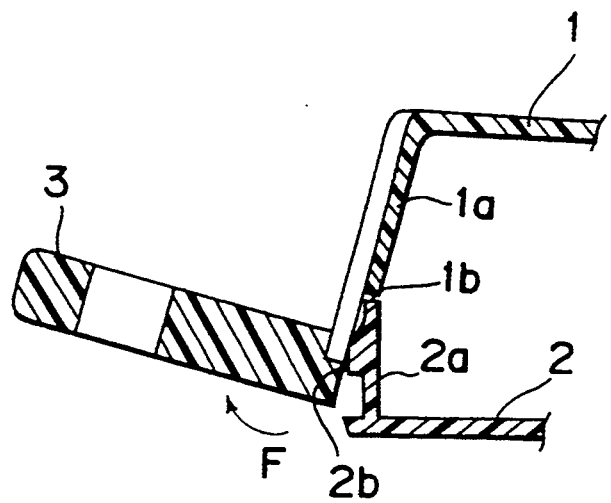
FIG. 9 is a cross section of the stay side of the conventional junction box.

As shown in FIG. 7, therefore, even when an external horizontal force F working to open the one side wall 1a of the upper case 1 to the outside is applied from the mounting stay 3, engagement of the locking flange 2c in the locking channel 1c restricts movement of the one side wall 1a of the upper case 1 horizontally to the outside. Deformation of the side wall 1a is thus prevented, and the case lock is not disengaged as occurs with the conventional locking hole 1b and locking claw 2b construction. The reliability of the junction box is thus improved.

It is to be noted that while the locking channel 1c is provided in the upper case 1 and the locking flange 2c is provided in the lower case 2 in this embodiment, the invention shall not be so limited and the locking flange 2c may be provided in the upper case 1 with the locking channel 1c provided in the lower case 2.

As described hereinabove, the case locking structure for a junction box according to the present invention locks the cases together against vertical external forces by the lock formed by engagement of the locking claws and locking holes, and locks the cases against horizontal external forces by the lock formed by engagement of the locking channel and locking flange. As a result, the upper and lower cases can be securely locked together against both vertically and horizontally applied external forces.

Specifically, with a box-like junction box wherein a stay for mounting the junction box to the vehicle body is provided projecting from the upper case, three of the side walls of both the upper and lower cases are locked together by matching locking claws and holes provided in the cases, and the remaining side walls at which the stay is provided are locked together by the vertically engaged locking channel and locking flange, the engaged locking channel and flange restrict any outward movement of the side wall and prevent deformation of the side wall when an external force acting to open the one side wall of the upper case to the outside is applied from the stay. As a result, the lock is not disengaged as happens with the conventional locking structure, and the reliability of the junction box is improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A case locking structure for locking a first case and a second case in a closed condition to define a junction box, said case locking structure comprising:

a first side wall having four sides and surrounding said first case;

a second side wall having four sides and surrounding said second case, said first and second side walls fittingly and slidingly inserted in an insert direction to each other to close said first and second cases;

at least one engaging member formed on only three of said four sides of said first side wall;

at least one engageable member formed on only three of said four sides of said second side wall for locking said first and second cases together in said insert direction;

only the fourth side of said first side wall having a locking channel formed in said insert direction with one end of said locking channel being opened;

a locking flange formed on only the fourth side of said second side wall for being slidingly engaged in said locking channel in said insert direction thereby holding said first and second side walls at the slidingly engaged position by said locking channel and said locking flange, together in a direction perpendicular to said insert direction; and a mounting stay projection formed on only the fourth side of one of said first side wall and second side wall and extending outwardly in the vicinity of said locking channel.

2. A case locking structure according to claim 1, wherein said at least one engaging member and said at least one engageable member are a claw and a recess, respectively.

3. A case locking structure according to claim 1, wherein said at least one engaging member and said at least one engageable member are a recess and a claw, respectively.

4. A case locking structure according to claim 1, wherein said second side wall fits into the inside of said first side wall.

* * * * *

UNITED STATES PATENT AND TRADEMARK OFFICE
CERTIFICATE OF CORRECTION

PATENT NO.   :   5,405,035
DATED        :   April 11, 1995
INVENTOR(S)  :   S. KATO It is certified that error appears in the above-indentified patent and that said Letters Patent is hereby corrected as shown below:

On the Title page, item [73]  Assignee", change "Yokkaichi" to ---Yokkaichi City---.

Signed and Sealed this

Fourteenth Day of May, 1996

Attest:

BRUCE LEHMAN

*Attesting Officer*    *Commissioner of Patents and Trademarks*